(12) United States Patent
Park et al.

(10) Patent No.: US 6,844,240 B2
(45) Date of Patent: Jan. 18, 2005

(54) SEMICONDUCTOR DEVICE HAVING TRENCH ISOLATION

(75) Inventors: Young-woo Park, Kyunggi-do (KR); Yong-chul Oh, Kyunggi-do (KR); Won-Seong Lee, Kyunggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/948,799

(22) Filed: Sep. 10, 2001

(65) Prior Publication Data

US 2002/0137279 A1 Sep. 26, 2002

Related U.S. Application Data

(62) Division of application No. 09/290,890, filed on Apr. 14, 1999, now Pat. No. 6,326,282.

(30) Foreign Application Priority Data

Apr. 16, 1998 (KR) .............................................. 98-13554

(51) Int. Cl.[7] .............................................. H01L 21/76
(52) U.S. Cl. ...................................... 438/435; 438/424
(58) Field of Search ................................ 438/248, 424, 438/435, 436, 437; 257/506, 510, 646

(56) References Cited

U.S. PATENT DOCUMENTS

| 4,571,819 A | 2/1986 | Rogers et al. |
| 4,666,556 A | 5/1987 | Fulton et al. |
| 5,189,501 A | 2/1993 | Kawamura et al. |
| 5,763,315 A | * 6/1998 | Benedict et al. ............ 4383/435 |
| 5,780,346 A | * 7/1998 | Arghavani et al. ............ 438/437 |
| 5,897,361 A | 4/1999 | Egawa |
| 5,985,735 A | 11/1999 | Moon et al. |
| 6,146,970 A | * 11/2000 | Witek et al. ................. 438/424 |
| 6,162,700 A | * 12/2000 | Hwang et al. ............... 438/424 |

OTHER PUBLICATIONS

Wolf et al.; "Silicon Processing for VLSI Era (vol. 1)"; pp. 183–185, 1986.

* cited by examiner

*Primary Examiner*—Michael Trinh
(74) *Attorney, Agent, or Firm*—Volentine Francos, PLLC

(57) ABSTRACT

A structure having trench isolation which protects a nitride liner in the trench during subsequent plasma processing. The structure includes a trench formed in a semiconductor substrate, the trench having sidewalls and a bottom. A thermal oxide layer is formed on the bottom and sidewalls of the trench so as to remove substrate damage caused during etching of the semiconductor substrate to form the trench. A material layer is formed on the thermal oxide layer so as to prevent the bottom and sidewalls of the trench from being oxidized. Then, a protection layer is formed on the oxidation barrier layer. The trench is filled with a trench fill material uniformly with respect to the bottom and sidewalls of the trench.

3 Claims, 6 Drawing Sheets

SEMICONDUCTOR DEVICE HAVING TRENCH ISOLATION

CROSS REFERENCE TO RELATED APPLICATIONS

This is a divisional application of application Ser. No. 09/290,890, filed Apr. 14, 1999, now U.S. Pat. No. 6,326,282 which is hereby incorporated by reference in its entirety for all purposes.

BACKGROUND OF THE INVENTION

1. Field of the Invention

The present invention relates to a method of fabricating a semiconductor device, and more particularly relates to a method of forming trench isolation with enhanced insulating characteristics thereof and structure formed thereby.

2. Description of the Related Art

The technology of isolating devices that are built on a semiconductor substrate becomes one important aspect of the industry of the integrated circuits. Improper device isolation will cause current leakages, which can consume significant power for the entire chip. In addition, improper device isolation can further escalate latch-up to damage the circuit's function momentarily or permanently. Still further, improper device isolation can produce noise margin degradation, voltage shift or crosstalk.

The conventional LOCOS (local oxidation of silicon) process is used to form regions which laterally isolate the active device regions in the integrated circuits. The LOCOS structure is typically formed by using a patterned silicon nitride layer together with a pad oxide underneath, which is utilized to relieve stress caused by the silicon nitride layer, to mask the active regions, followed by ion-implantation in the isolation region, and then growing a thick field oxide locally.

The structure mentioned above possesses some inherent drawbacks resulting from the processes, i.e., lateral oxidation of the silicon underneath the silicon nitride mask, making the edge of the field oxide which resembles the shape of a bird's beak, and the lateral diffusion of channel-stop dopants, making the dopants encroach into the active device regions, making the physical channel width less than the desired channel width. The reduced portion overtaken by both effects will make the situation even worse when devices are scaled down for very large scale integration (VLSI) implementation, increasing the threshold voltage and reducing the current driving capability.

According to the disadvantage mentioned above for the LOCOS isolation structure, an isolation technique by using a shallow trench has been developed. Generally, the shallow trench isolation (hereinafter referred to "STI") includes the steps of etching a silicon substrate to form a trench; and depositing a CVD oxide layer to fill up the trench; and planarization-etching the CVD oxide layer.

FIGS. 1A to 1E schematically show cross-sectional views of the process steps of a prior art method of forming trench isolation in a semiconductor substrate. Referring to FIG. 1A, a pad oxide layer 3, a nitride layer 4, an HTO (high temperature oxidation) oxide layer 5, and an ARL (anti-reflective layer) 6 are sequentially formed over the semiconductor substrate 2. A photoresist layer pattern 10 is formed over the ARL 6 to define a trench forming area. Using this patterned photoresist layer 10 as a mask, in order the ARL 6, HTO oxide layer 5, silicon nitride layer 4, and pad oxide layer 3 are etched to form a trench mask 8, exposing the semiconductor substrate (2).

After removing the patterned photoresist layer 10, the semiconductor substrate 2 is etched to form a trench 12 therein as shown in FIG. 1B. Preferably, the ARL 6 is concurrently removed. In order to remove substrate damage produced during the aforementioned etching process, a thermal oxide layer 14 is formed on interior walls of the trench 12, i.e., on bottom and both sidewalls of the trench as shown in FIG. 1C.

Referring to FIG. 1D, the remainder of the trench is completely filled with a dielectric layer such as a USG layer (undoped silicate glass layer) 15 extending on the trench mask (8a). A PE-TEOS (plasma enhanced tetra ethyl ortho silicate) oxide layer 16 is subsequently formed thereon to relieve the stress of the USG layer 15. A planarization process is carried out down to the nitride layer 4 and thereby the trench isolation 18 is produced as shown in FIG. 1E. Subsequently the nitride layer 4 and the pad oxide layer 3 are removed by a suitable method.

However, in the STI method, a known problem has been that of stress caused by the dielectric layer, such as the USG layer 15, filled in the trench on the semiconductor substrate. Furthermore, additional stress is applied to the interior walls of the trench 12 during a later oxidation process such as gate oxide layer formation. In other words, the trench interior walls are subjected to being oxidized, and the oxide layer thus formed causes stress resulting from volume expansion. Such stress causes micro defects i.e., dislocation due to damage of the silicon lattice, or shallow pits on the bottom and sidewalls of the trench, and on the active region of the semiconductor substrate, thereby increasing current leakage, constantly putting the source and drain electrodes of the transistor in a "turned-on" state and, in addition, causing a thinning phenomenon for the gate oxide layer on the edge of the active region in the semiconductor substrate, which degrades the insulating characteristics of the trench isolation.

U.S. Pat. No. 5,447,884, entitled "Shallow Trench Isolation with Thin Nitride Layer" illustrated a silicon nitride liner on the thermal oxide layer that is used to relieve the stress.

In order to uniformly fill a dielectric layer in the trench, plasma processing is carried out conventionally on the interior walls of the trench. However, due to plasma processing in down-stream mode, the silicon nitride layer as a stress relief layer is subjected to being etched or damaged, which is not compatible with the aims of the silicon nitride layer.

Accordingly, the prior art method mentioned by the patent cannot avoid the above problems.

SUMMARY OF THE INVENTION

The present invention was made in view of the above problem, and it is therefore an object of the invention to provide a method of forming trench isolation in a semiconductor substrate which can prevent oxidizing the trench interior walls and alleviate a stress induced thereby during trench fill processing or a later oxidation processing.

It is an another object of this invention to provide trench isolation including a first and a second oxide layer formed on the bottom and sidewalls of the trench, a nitride liner disposed therebetween, and a trench fill dielectric layer. Forming an oxide layer on the silicon nitride liner protects the silicon nitride liner during plasma processing, or forming a trench dielectric layer.

To achieve these and other advantages and in accordance with the purpose of the present invention, the method includes sequentially forming a pad oxide layer, a Young-woo Park et al. silicon nitride layer, an HTO (high temperature oxide) layer, and an ARL (anti-reflective layer) on a semiconductor substrate. The HTO oxide layer and ARL layer may not be formed depending on the process conditions. These layers are etched to form a trench mask using a patterned photoresist layer. After removing the patterned photoresist layer, the semiconductor substrate is etched using the trench mask. A thermal oxide layer is formed on the bottom and both sidewalls of the trench to remove the substrate damage resulting from the step of etching the semiconductor substrate. A nitride liner is formed on the thermal oxide layer so as to prevent oxidation of the trench in the subsequent oxidation process. This nitride liner is preferably made of a silicon rich nitride layer exhibiting relatively low stress characteristics and serves as a stress buffer layer to relieve the stress applied to the trench interior walls during the subsequent oxidation process. A high temperature oxide layer such as HTO and LP-TEOS oxide layers is formed on the silicon nitride liner. This high temperature oxide layer is provided for the purpose of protecting the silicon nitride liner, i.e., preventing the silicon nitride liner from being damaged or etched during subsequent plasma processing and trench fill dielectric layer forming process. After forming a high temperature oxide layer, a trench fill layer is deposited to fill up the remainder of the trench. The fill dielectric layer may be preferably a USG layer ($O_3$-TEOS). Preferably a PE-TEOS layer or PE-OX layer is deposited on the USG layer so as to relieve the stress of the USG layer. In order to densify the USG layer, an annealing process is carried out in nitrogen atmosphere or in a wet atmosphere(e.g., $H_2$ and $O_2$ atmosphere). A planarization Young-woo Park et al. process is carried out down to the silicon nitride layer. After removing the silicon nitride layer and the pad oxide layer, a conventional transistor formation process is performed.

In accordance with the present invention, the trench isolation layer is made of a thermal oxide layer, a silicon rich nitride layer, a high temperature oxide layer, and a trench fill dielectric layer. The high temperature oxide layer is advantageously formed to protect the underlaying silicon rich nitride layer which serves as a stress relief layer and an oxidation barrier layer.

BRIEF DESCRIPTION OF THE DRAWINGS

This invention may be understood and its objects will become apparent to those skilled in the art by reference to the accompanying drawings as follows.

DETAILED DESCRIPTION OF THE PREFERRED EMBODIMENT

The preferred embodiment of the present invention will now be described with reference to the accompanying drawings.

Figure 1A:
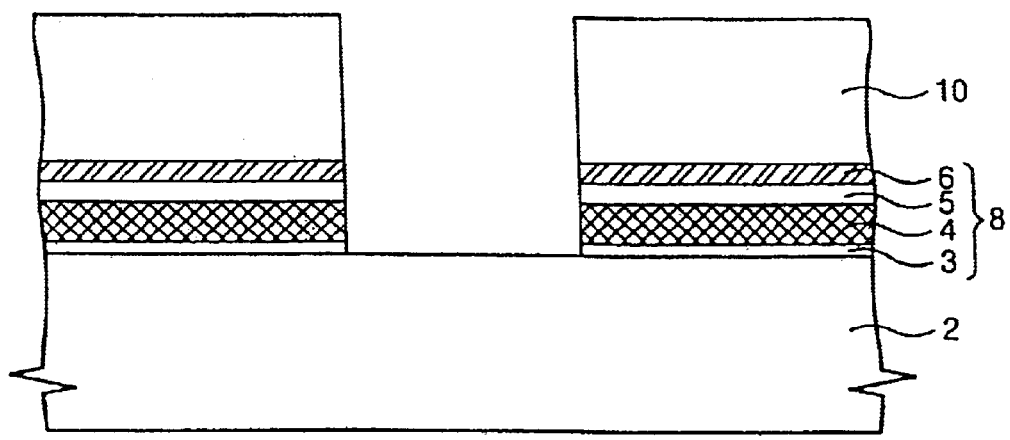
FIGS. 1A to 1E are flow diagrams showing the process steps of a prior art method of forming a trench isolation.
Figure 1B:
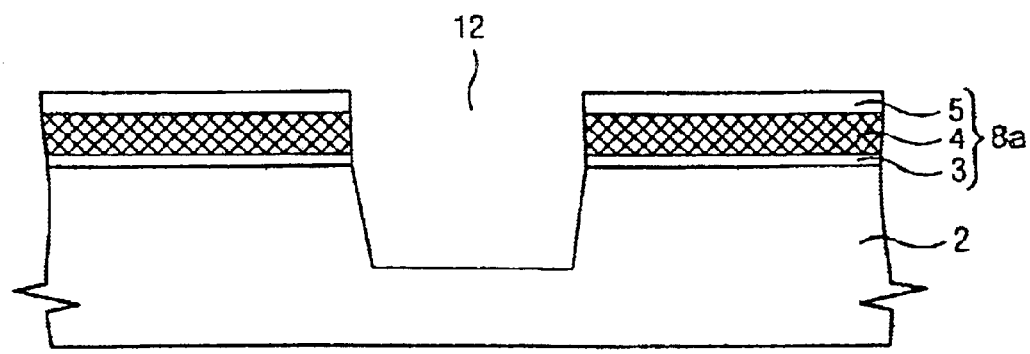
Figure 1C:
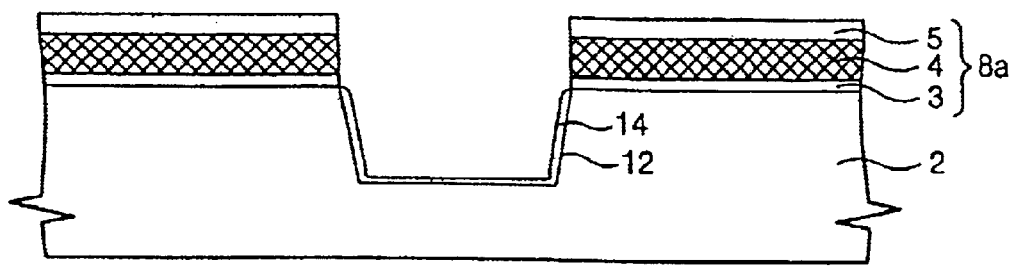
Figure 1D:
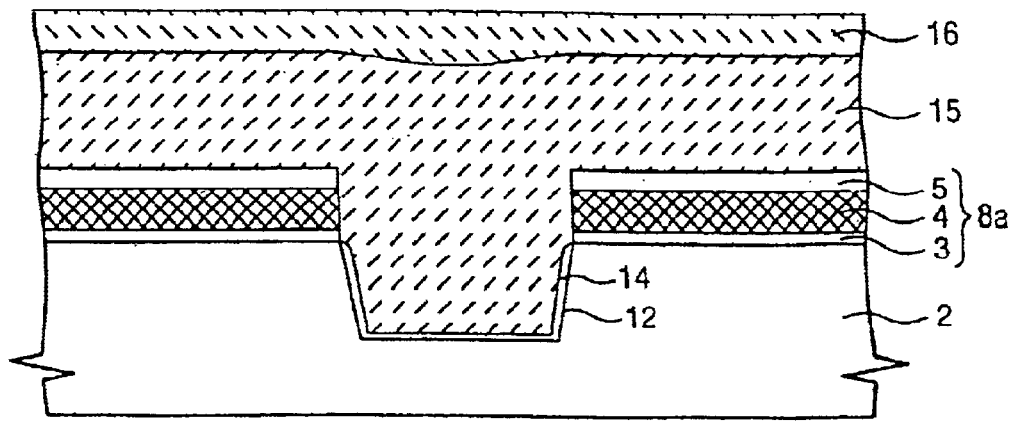
Figure 1E:
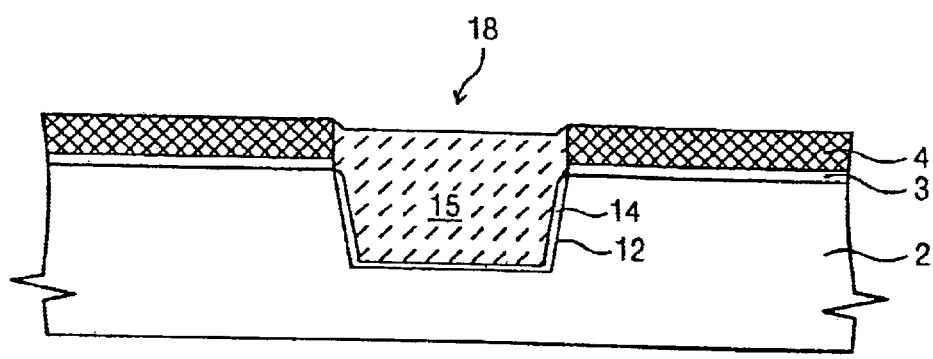
Figure 2A:
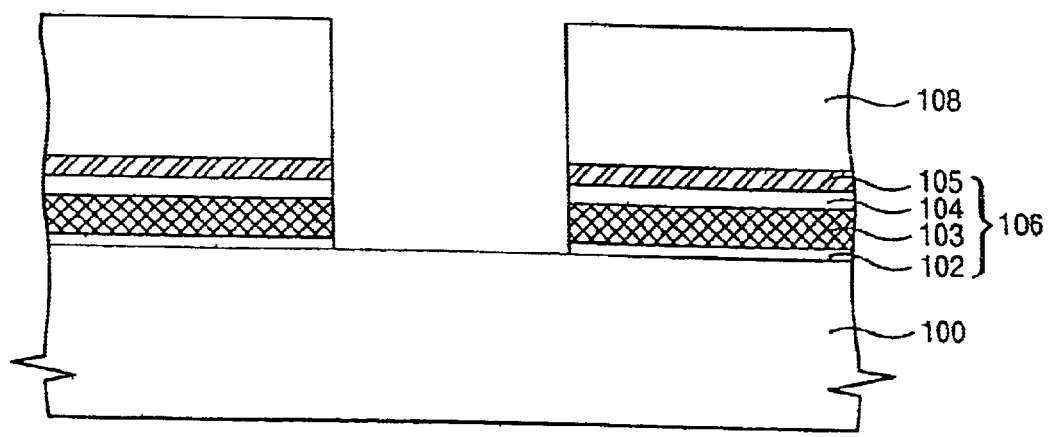
FIGS. 2A to 2E are flow diagrams showing the process steps of a novel method of forming a trench isolation.

FIG. 2A shows schematically a cross-sectional view of a semiconductor substrate 100 having already undergone several steps in accordance with the present invention. A pad oxide layer 102 and a nitride layer 103, an HTO (high temperature oxidation) oxide layer 104, and an ARL (anti-reflective layer) 105 are sequentially formed on a top surface of the semiconductor substrate 100. The pad oxide layer 102 is formed by a thermal oxidation process and has a thickness of about 70 Å to 160 Å. The nitride layer 103 is formed to have a thickness of about 1500 Å and the HTO oxide layer 104 has a thickness of about 500 Å. The ARL 105 is made of a silicon oxynitride (SiON) layer and has a thickness of about 600 Å. The ARL layer 105 serves to minimize the critical dimension (CD) variation during photolithography process. The HTO oxide layer 104 and the ARL 105 may not be formed depending on the process conditions. A photoresist layer is spin coated and patterned into the desired configuration 108. Using this patterned photoresist layer 108, the ARL 105, HTO oxide layer 104, the nitride layer 103, and the pad oxide layer 102 are etched to form a trench mask 106 therein in order.

Figure 2B:
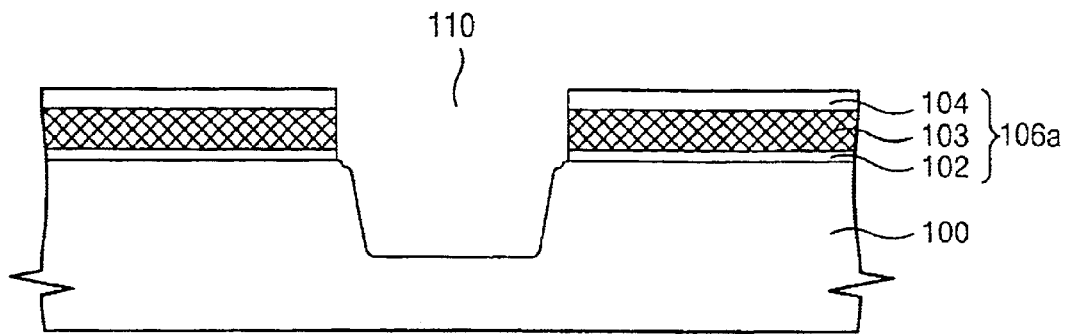

After removing the patterned photoresist layer 108 using a conventional method such as $O_2$ plasma ashing and stripping, the semiconductor substrate 100 exposed by the trench mask 106 is etched to form a trench 110 by using the trench mask as shown in FIG. 2B. The etching process employs a dry etching such as RIE (reactive ion etching) and the depth of the trench is about 0.1 μm to 1.5 μm and a preferred depth is about 0.25 μm. The top edges of the trench can be formed to have step profiles or a slope profile so as to prevent the thinning phenomenon of a subsequent gate oxide layer. During the step of forming the trench 110, the ARL 105 is removed.

Figure 2C:
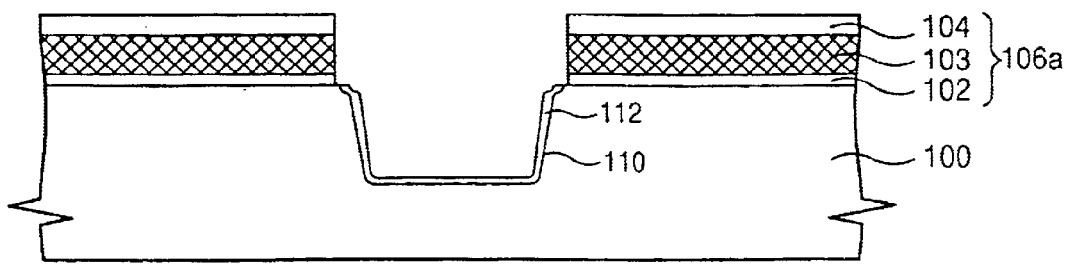

Referring to FIG. 2C, a thermal oxide layer 112 is formed on the interior walls of the trench 110, i.e., on the bottom and sidewalls, so as to remove substrate damage caused by the step of etching the semiconductor substrate 100. The substrate damage includes silicon crystalline defects and serves as a leakage source. This thermal oxide layer 112 is formed to have a thickness of about 100 Å to 500 Å.

Figure 2D:
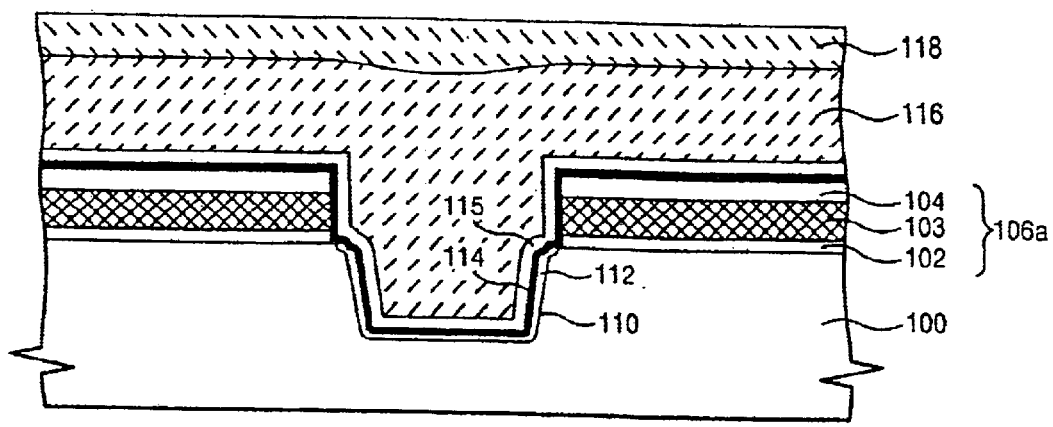

Referring to FIG. 2D, a nitride liner 114 is formed on the trench mask layer 106a including the thermal oxide layer 112 so as to prevent oxidation of the trench interior walls in the subsequent oxidation process. This nitride liner 114 is formed by a LPCVD method to a thickness of about 30 Å to 200 Å and preferably made of a silicon rich nitride liner exhibiting relatively low stress characteristics. Herein the term "silicon rich" means that the silicon component is relatively great as compared to the other component of the silicon nitride layer. Also the nitride liner 114 serves as a stress buffer layer to relieve the stress applied to the trench interior walls during the subsequent oxidation process.

A high temperature oxide layer 115, such as HTO or LP-TEOS oxide layer is formed on the silicon nitride liner 114. This high temperature oxide layer 115 is provided for the purpose of protecting the silicon nitride liner 114, i.e., preventing the silicon nitride liner 114 from being damaged or etched during subsequent plasma processing and trench fill dielectric layer forming process. Such high temperature oxide layer 115 is formed to a thickness of about 10 Å to 1,000 Å.

After forming the high temperature oxide layer 115 on the silicon nitride liner 114, plasma processing is performed on the surface of the high temperature oxide layer 115 using $NH_3$ for the purpose of uniformity in subsequently formed trench fill layer 116. Owing to the high temperature oxide layer 115, the underlying nitride liner 114 is protected during this plasma processing. After this plasma processing, the trench fill dielectric layer 116, preferably composed of a USG ($O_3$-TEOS) layer, is deposited to fill remainder of the trench. This USG layer 116 is formed to have a thickness of about 5,000 Å. In addition, to relieve the stress of the USG layer 116, a PE-TEOS or PE-OX layer 118 can be formed thereon.

In order to densify the USG layer 116, an annealing process is carried out in nitrogen atmosphere or in a wet atmosphere (e.g., $H_2$ and $O_2$ atmosphere) at a temperature above 900° C. so as to prevent unacceptable recess of the USG layer 116 during a subsequent planarization process. Alternatively the annealing process can be carried out at a temperature below 850° C., for example, about 700° C.

Figure 2E:
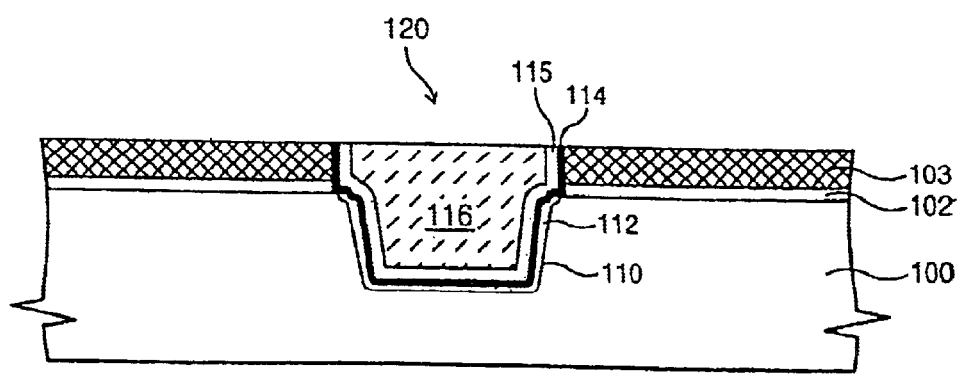

A planarization process is carried out down to the silicon nitride layer 103 as shown in FIG. 2E, thereby forming an isolation trench 120. During this planarization process the silicon nitride layer 103 serves as an etching stop layer and no substantial step is formed between the active and inactive region.

After removing the silicon nitride layer 103 and the pad oxide layer 102, a conventional transistor 124 formation process is performed.

Figure 3:
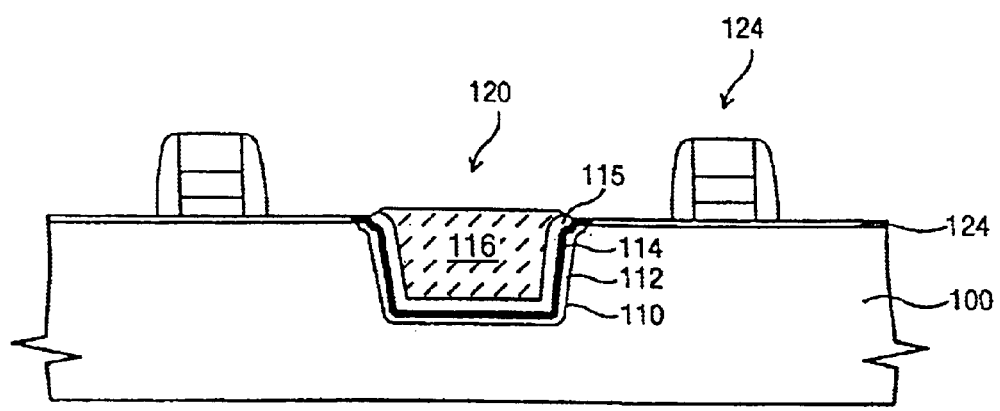
FIG. 3 schematically shows a cross-sectional view of a trench isolation structure formed in accordance with a preferred embodiment of the present invention.

FIG. 3 schematically shows a cross-sectional view of a semiconductor substrate 100 with isolation trench 120 and transistor 124. Referring to FIG. 3, the isolation trench 120 is comprised of a trench 110 having a bottom and sidewalls, a 100 Å to 500 Å thick thermal oxide layer 112 formed on the bottom and sidewalls, a 30 Å to 200 Å thick nitride liner 114 formed on the thermal oxide layer 112, a 10 Å to 1,000 Å thick high temperature oxide layer 115 on the nitride liner 114, and trench fill dielectric layer 116 formed on the remainder of the trench.

While this invention has been particularly shown and described with reference to the preferred embodiments thereof, it will be understood by those skilled in the art that various changes in form and details may be made without departing from the spirit and scope of this invention.

What is claimed is:

1. A trench isolation structure comprising:
   a trench formed in a semiconductor substrate, said trench having sidewalls and a bottom;
   a first and a second oxide layer formed on said bottom and sidewalls of said trench and a silicon-rich nitride layer disposed therebetween, said silicon-rich nitride layer having greater silicon content as respectively compared to other constituent components; and
   a third oxide layer formed on said second oxide layer as to fill up said trench,
   wherein said second oxide layer is one selected from a group consisting of a deposited HTO oxide layer and LP-CVD oxide layer.

2. The trench isolation structure according to claim 1, wherein said silicon-rich nitride layer is an oxidation barrier layer, preventing said bottom and sidewalls of said trench from being oxidized, and further is a stress relief layer, relieving stress applied to said bottom and sidewalls of said trench.

3. The trench isolation structure according to claim 1, wherein said second oxide layer has a thickness of about 10 Å to 1,000 Å.

* * * * *